United States Patent [19]

Ishikawa

[11] Patent Number: 5,719,814
[45] Date of Patent: Feb. 17, 1998

[54] SEMICONDUCTOR MEMORY DEVICE CAPABLE OF STORING HIGH POTENTIAL LEVEL OF DATA

[75] Inventor: Toru Ishikawa, Tokyo, Japan

[73] Assignee: NEC Corporation, Tokyo, Japan

[21] Appl. No.: 719,880

[22] Filed: Sep. 25, 1996

[30] Foreign Application Priority Data

Oct. 31, 1995 [JP] Japan ................................ 7-282922

[51] Int. Cl.$^6$ .................................................. G11C 7/00
[52] U.S. Cl. ................ 365/205; 365/149; 365/230.06; 327/51
[58] Field of Search ..................... 365/149, 190, 365/205, 230.06; 327/51, 57

[56] References Cited

U.S. PATENT DOCUMENTS

| | | | |
|---|---|---|---|
| 5,297,104 | 3/1994 | Nakashima | 365/230.06 |
| 5,404,330 | 4/1995 | Lee et al. | 365/230.06 X |
| 5,412,331 | 5/1995 | Jun et al. | 365/230.06 X |
| 5,444,662 | 8/1995 | Tanaka et al. | 365/205 |

FOREIGN PATENT DOCUMENTS

2-247892  10/1990  Japan .

OTHER PUBLICATIONS

"Dynamic RAM Circuits" by H.B. Bakoglu, Circuits Interconnections and Packaging for VLSI, pp. 155–161, 1990, Addison Wesley.

Primary Examiner—David C. Nelms
Assistant Examiner—Huan Hoang
Attorney, Agent, or Firm—Foley & Lardner

[57] ABSTRACT

In a semiconductor memory device, a row decoder is connected to a plurality of word lines to select one of the plurality of word lines in response to a row address. A word line driving section drives, in response to a row address strobe signal, the selected word line to a first potential higher by a predetermined potential than a predetermined second potential, for a read or write operation to a selected memory cell connected to the selected word line and a selected pair of bit lines. The second potential is higher than a power supply higher side potential. A sense amplifier activating section issues sense amplifier activating signals for the write operation to the selected memory cell in response to a sense control signal such that a data having a potential higher than the power supply higher side potential can be written or rewritten in the selected memory cell. Each of a plurality of sense amplifiers amplifies the data on corresponding pair of bit lines in response to the sense amplifier activating signals. In the read operation, the read data is outputted from an input/output section via a column selecting section for selecting and connecting one of the plurality of pairs of bit lines to the input/output section in response to a column address.

16 Claims, 10 Drawing Sheets

Fig. 2 PRIOR ART
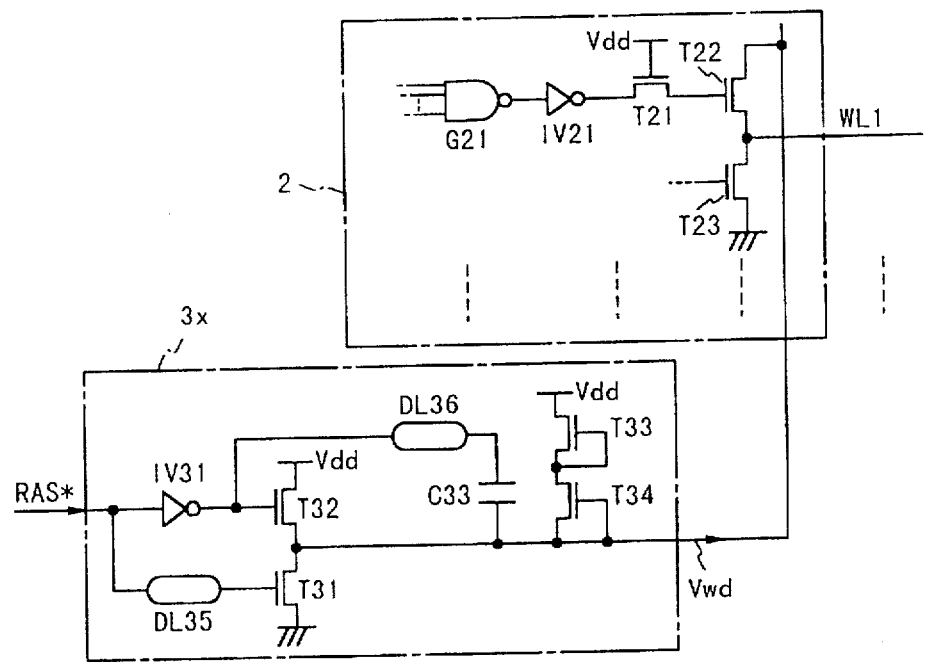
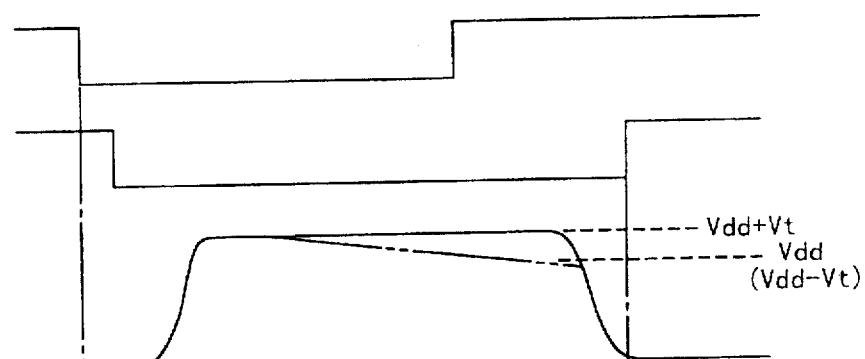
Fig. 3A PRIOR ART RAS*
Fig. 3B PRIOR ART PRC
Fig. 3C PRIOR ART WL1
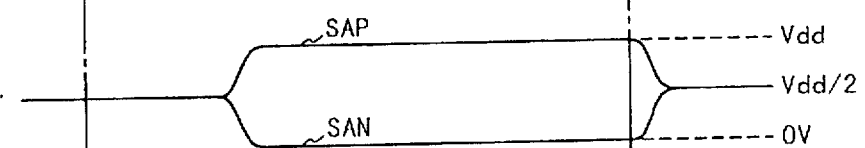
Fig. 3D PRIOR ART SAP, SAN
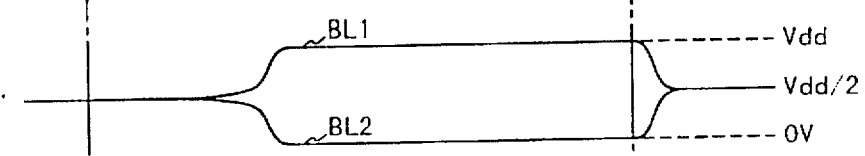
Fig. 3E PRIOR ART BL1, BL2

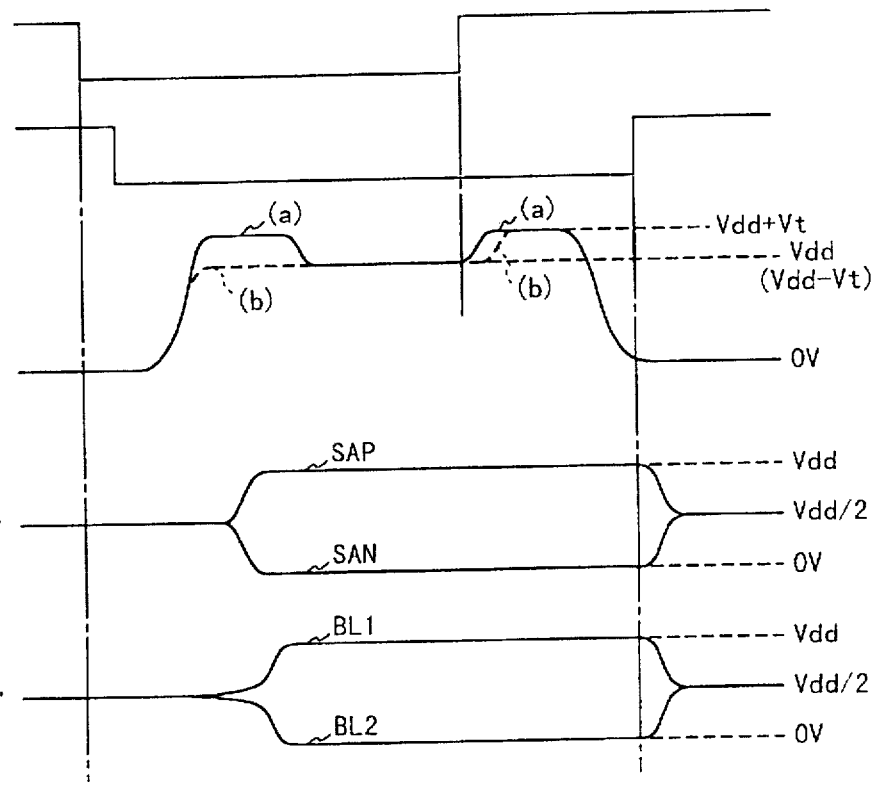

SEMICONDUCTOR MEMORY DEVICE CAPABLE OF STORING HIGH POTENTIAL LEVEL OF DATA

BACKGROUND OF THE INVENTION

1. Field of the Invention

The present invention relates to a dynamic-type semiconductor memory device, and more particularly to a dynamic-type semiconductor memory device in which data having a potential level higher than a power supply higher side potential can be stored in a memory cell.

2. Description of Related Art

FIG. 1 shows the structure of a typical example (the first example) of a conventional dynamic-type semiconductor memory device. Referring to FIG. 1, the dynamic-type semiconductor memory device includes a memory cell array 1 composed of a plurality of memory cells MCs (MC11 to MC1n, . . . MCmn) arranged in a matrix in rows and columns, a plurality of word lines WLs (WL1 to WLn) connected to a row decoder 2 which selects one from among the plurality of word lines WLs in accordance with a row address signal ADr, a word line driving circuit 3x connected to the row decoder 2 to drive the selected word line, a plurality of bit lines BLs (BL1 to BL2 . . . ) connected to memory cells of a column, a plurality of flip-flop-type sense amplifiers SAs (SA1 . . . ) each of which amplifies the data on a corresponding pair of bit lines BLs, a precharging circuit 4 connected to the pairs of bit lines, for equalizing and precharging the potentials of the bit lines BLs of each pair to a half Vpr of the power supply higher side potential Vdd in response to a precharge control signal PRC, a column switching circuit 5 for connecting the pair of bit lines BLs to input/output lines I01 and I02 in response to a column selection signal SWc, and a sense amplifier activating circuit 6x for controlling the sense amplifiers SAs to be activated in response to sense amplifier activating signals SAP and SAN. Each memory cell MC includes a switching MOS transistor Q1 and a capacity element C1 connected thereto in series.

FIG. 2 illustrates the elements of the word line driving circuit 3x and a part of the row decoder 2. Referring to FIG. 2, the word line driving circuit 3x is composed of an inverter IV31, a delay circuit DL35, transistors T31 and T32 of an N-channel type, a delay circuit DL36, and a capacitive element C33. The word line driving circuit 3x supplies the word line driving voltage Vwd to the row decoder 2 from the connection node of the transistors T31 and T32. In the word line driving circuit 3x, when the row address strobe signal RAS* is changed to the active level, i.e., the low level, the transistor T32 is turned on immediately and the transistor T31 is turned off after the predetermined delay time. As a result, the word line driving voltage Vwd at the connection node of these transistors T31 and T32 is changed into the power supply voltage Vdd, and then is boosted to the voltage (Vdd+Vt) by the delay circuit DL36 and the capacitive element C33.

Next, the operation of the dynamic-type semiconductor memory device will be described with reference to signal wave forms shown in FIGS. 3A to 3E. When the row address strobe signal RAS* is changed to the low level as the active level as shown in FIG. 3A, a precharge control signal PRC is first changed to the low level as the inactive level as shown in FIG. 3B, so that the precharging operation of the bit lines BL1, BL2 . . . is stopped. After this, one of the word lines, e.g., WL1 is selected by the row decoder 2 as shown in FIG. 3C and is set to the selection level. As a result, one of the memory cells which is connected to the word line WL1 in the selection level, e.g., the memory cell MC11 is set to the selected state and connected to the corresponding bit line. The potential of the bit line BL1 connected to the memory cell MC11 changes from the precharge potential Vpr (=Vdd/2) in accordance with the data stored in the selected memory cell MC11 as shown in FIG. 3E. On the other hand, there is no memory cell which is connected to the bit line BL2 which corresponds to the bit line BL1. Therefore, the potential of the bit line BL2 remains at the precharge potential Vpr.

Thereafter, the sense amplifier activating signals SAP and SAN which change from the precharge potential Vpr to the power supply voltage Vdd potential and the ground potential Vee are supplied from the sense amplification activation circuit 6x to the sense amplifier SA1 as shown in FIG. 3D. The sense amplifier SA1 connected to the pair of bit lines BL1 and BL2 is activated and amplifies the voltage difference between the bit lines BL1 and BL2 so that the potential of one of the bit lines BL1 and BL2, e.g., the bit line BL1 in the example, is set to high level and the potential on the other, e.g., bit line BL2 is set to the ground potential Vee (=0 V) as shown in FIG. 3E. Then, the column selection signal SWc is activated so that the data on the bit lines BL1 and BL2 are transfer to input/output lines I01 and I02 and outputted to the outside of the semiconductor memory device.

Also, one of the amplified data on bit lines BL1 and BL2, e.g., the data on the bit line BL1 in this example, is transferred to the capacitive element C1 of the selected memory cell MC11, and re-written. At that time, when the row address strobe signal RAS* is changed to the high level as the inactive level as shown in FIG. 3A so that the corresponding word line WL1 is changed into the non-selection level, the refreshing operation or the re-writing operation is ended. As a result, the data re-written is held by the memory cell MC11. Thereafter, the bit lines BL1 and BL2 are precharged to the precharge potential Vpr (=Vdd/2) in response to the precharge control signal PRC as shown in FIG. 3E so that the sense amplification activating signals SAP and SAN are set to the precharge potential Vpr as shown in FIG. 3D.

In the conventional dynamic semiconductor memory device, because the selection level of the word line which sets the memory cell to the selected state is set to a potential which is higher, by the threshold voltage of the switching transistor Q1 of the memory cell MC, than the power supply voltage Vdd potential level, the data having the power supply voltage Vdd potential level of the bit line can be stored in the capacitive element C1 of the memory cell MC11 just as it is, without influence of a voltage drop by switching transistor Q1 in the event of a writing operation and re-writing operation. Therefore, there is no loss by the transistor Q1 on the memory cell in the event of a read operation, so that the operation margin can be extended in the case of the sense amplification, resulting in high-speed operation.

However, because the selected word line is driven with the voltage boosted above the power supply voltage Vdd, excessive stress is imposed on the transistors which are connected to the selected word line. As a result, there is the problem that degradation of the transistors is accelerated. Also, if the duration for which a word line is held in the selection level becomes long, there is another problem in that the selection level of the selected word line is decreased as shown in FIG. 3C by the two-dot chain line, such that the voltage drop by the switching transistor Q1 can been seen so that the voltage in the writing operation or rewriting operation drops. In order to solve these problems, there is proposed a conventional example, e.g., Japanese Laid Open Patent Disclosure (Heisei 2-247892), in which the selection level of the selected word line is set to a voltage higher than the power supply voltage Vdd potential level during a predetermined time period after the rising edge of the selection level or during a predetermined time period before the falling edge of the selection level.

FIGS. 4A and 4B show second and third examples of word line driving circuits in a dynamic type semiconductor memory device in which the selection level of the selected word line is set to a voltage higher than the power supply voltage Vdd potential level during predetermined time periods associated with the timings of the rising edge and the falling edge.

In the word line driving circuit 3y shown in FIG. 4A, when the row address strobe signal RAS* is set to low level as the active level as shown in FIG. 5A, the transistor T32 is turned on and the transistor T31 is turned off such that the voltage Vwd of the connection node between these transistors T31 and T32 is set to the power supply voltage (Vdd−Vt). As a result, the word line driving voltage Vwd is boosted to the voltage (Vdd+Vt) only during the period corresponding to a delay time determined by a delay circuit DL38, an EX-OR gate G31 and a capacitive element C34 as shown in FIG. 5C by the solid line wave form. Also, because the row address strobe signal RAS* is changed to the high level as the inactive level as shown in FIG. 5A, after the word line driving voltage Vwd is boosted to the voltage (Vdd+Vt) during a predetermined time period by the delay circuit DL38, the EX-OR gate G31 and the capacitive element, the transistor T31 is turned on and then the word line driving voltage Vwd is decreased to 0 V.

In the word line driving circuit 3z shown in FIG. 4B, when the row address strobe signal RAS* is set to the active level, the transistor T32 is turned on and subsequently the transistor T31 is turned off. As a result, the voltage Vwd of the connection node between these transistors T31 and T32 is changed into Vdd (Vdd−Vt) as shown in FIG. 5C by the dashed line. Then, when the row address strobe signal RAS* is changed to the inactive level, the word line driving voltage Vwd is boosted to the voltage (Vdd+Vt) by the delay circuit DL39 and the capacitive element C35. Then, the transistor T31 is turned on and the word line driving voltage Vwd is decreased to 0 V.

In the third example, the selection level of the selected word line is set to the power supply voltage (Vdd+Vt) only during the predetermined period after the row address strobe signal RAS* goes up to the inactive level. Therefore, a data can be written in a memory cell without decreasing the high level potential of data having a potential equivalent to the power supply voltage Vdd in the case of the writing and re-writing operations. Also, in the second example shown in FIG. 4A, because the selection level of the selected word line is set to the voltage Vdd+Vt only during a predetermined time period after the rising edge when the row address strobe signal RAS* is set to the active level, it is possible to improve the operation speed in the reading operation of a data from the memory cell. Further, in these examples, the degradation of the switching transistors and so on can be reduced.

In the first to third examples of the above-mentioned conventional dynamic-type semiconductor memory device, the selection level of the selected word line is set to a voltage which is higher, by a threshold voltage of a switching transistor of the memory cell, than the power supply voltage Vdd in the writing and the re-writing operations of the data to the memory cell. As a result, it is prevented that the high level of data is decreased to the power supply voltage Vdd due to the switching transistor of the memory cell.

However, the potential of the data written in the memory cell is at the highest power supply voltage Vdd. At the present time when the power supply voltage is being made low, the potential level on the high level side of a data written in the memory cell is also low. Therefore, there is a problem in that the read operation speed is decreased. The read operation speed can be improved as the potential level of the high level side of the data is increased.

SUMMARY OF THE INVENTION

Therefore, the object of the present invention is to provide a dynamic-type semiconductor memory device in which, even if a power supply voltage is made low, the potential level of the high level side of a data written in a memory cell can be made high, so that the read operation speed can be improved.

In order to achieve an object of the present invention, a semiconductor memory device may include a memory cell array including a plurality of memory cells arranged in a matrix, a plurality of pairs of bit lines, the memory cells in each of columns of the matrix being associated with one of the plurality of pairs of bit lines corresponding to the column, a plurality of word lines, the memory cells in each of rows of the matrix being connected to one of the plurality of word lines corresponding to the row, a sense amplifier section composed of a plurality of sense amplifiers respectively provided for the plurality of pairs of bit lines, wherein each of the plurality of sense amplifiers amplifies a data on the corresponding pair of bit lines in response to sense amplifier activating signals, a row decoder connected to the plurality of word lines, for selecting one of the plurality of word lines in response to a row address, an input/output section provided to be connectable to the plurality of pairs of bit lines, for inputting or outputting a data, a column selecting section for selecting and connecting one of the plurality of pairs of bit lines to the input/output section in response to a column address, a word line driving section for driving, in response to a row address strobe signal, the word line selected by the row decoder to a first potential higher by a predetermined potential than a second predetermined potential, for a read or write operation to one memory cell connected to the selected word line and the pair of bit lines selected by the column selecting section as a selected memory cell, the second potential being higher than a power supply higher side potential, and a sense amplifier activating section for issuing the sense amplifier activating signals to the sense amplifier section for the write operation to the selected memory cell in response to a sense control signal such that one of the bit lines of the selected pair is driven to the second potential.

In this case, the word line driving section may drive the selected word line to the first potential while the word line is in a selected state. Alternatively, the word line driving section may drive the selected word line to the first potential during a first predetermined time period when a data is read from the selected memory cell and a second predetermined time period when the read data is re-written in the selected memory cell or a data is written in the selected memory cell. The sense amplifier activating section issues the sense amplifier activating signals to the sense amplifier section in response to the sense control signal such that a bit line of the selected pair of bit lines is driven to the second potential when a data read from the selected memory cell is rewritten in the selected memory cell or a data is written in the selected memory cell.

If there is provided an internal voltage dropping circuit for dropping a supply voltage externally supplied, the second potential is a potential corresponding to the supply voltage externally supplied.

Also, if there is provided an internal voltage boosting circuit for boosting a supply voltage externally supplied, the second potential is a potential corresponding to the boosted supply voltage.

In order to achieve another object of the present invention, a method of accessing a semiconductor memory device, may comprise the steps of:

selecting one of a plurality of word lines in response to a row address, wherein a memory cell array includes a plurality of memory cells arranged in a matrix manner, and the memory cells in each of the rows is connected to one of the plurality of word lines corresponding to the row;

driving, in response to a row address strobe signal, the selected word line to a first potential which is higher, by a predetermined potential, than a predetermined second potential, the second potential being higher than a power supply higher side potential;

reading a data from one memory cell as a selected memory cell connected to the selected word line and a selected one of a plurality of pairs of bit lines;

issuing sense amplifier activating signals in response to a sense control signal;

amplifying the data read from the selected memory cell onto the selected pair of bit lines in response to sense amplifier activating signals; and selectively outputting the data on the selected pair of bit lines.

BRIEF DESCRIPTION OF THE DRAWINGS

FIG. 2 is a circuit diagram illustrating the structure of a a first example of word line driving circuit of the conventional dynamic-type semiconductor memory device shown in FIG. 1;

FIGS. 3A to 3E are diagrams of signal wave forms of various portions to explain the operation of the conventional dynamic-type semiconductor memory device;

FIGS. 5A to 5E are diagrams of signal wave forms of various portions to explain the operation of the conventional dynamic-type semiconductor memory device shown in FIGS. 4A and 4B;

DESCRIPTION OF THE PREFERRED EMBODIMENTS

Next, examples of semiconductor memory device in accordance with the present invention will be described below in detail with reference to the accompanying drawings.

Figure 6:
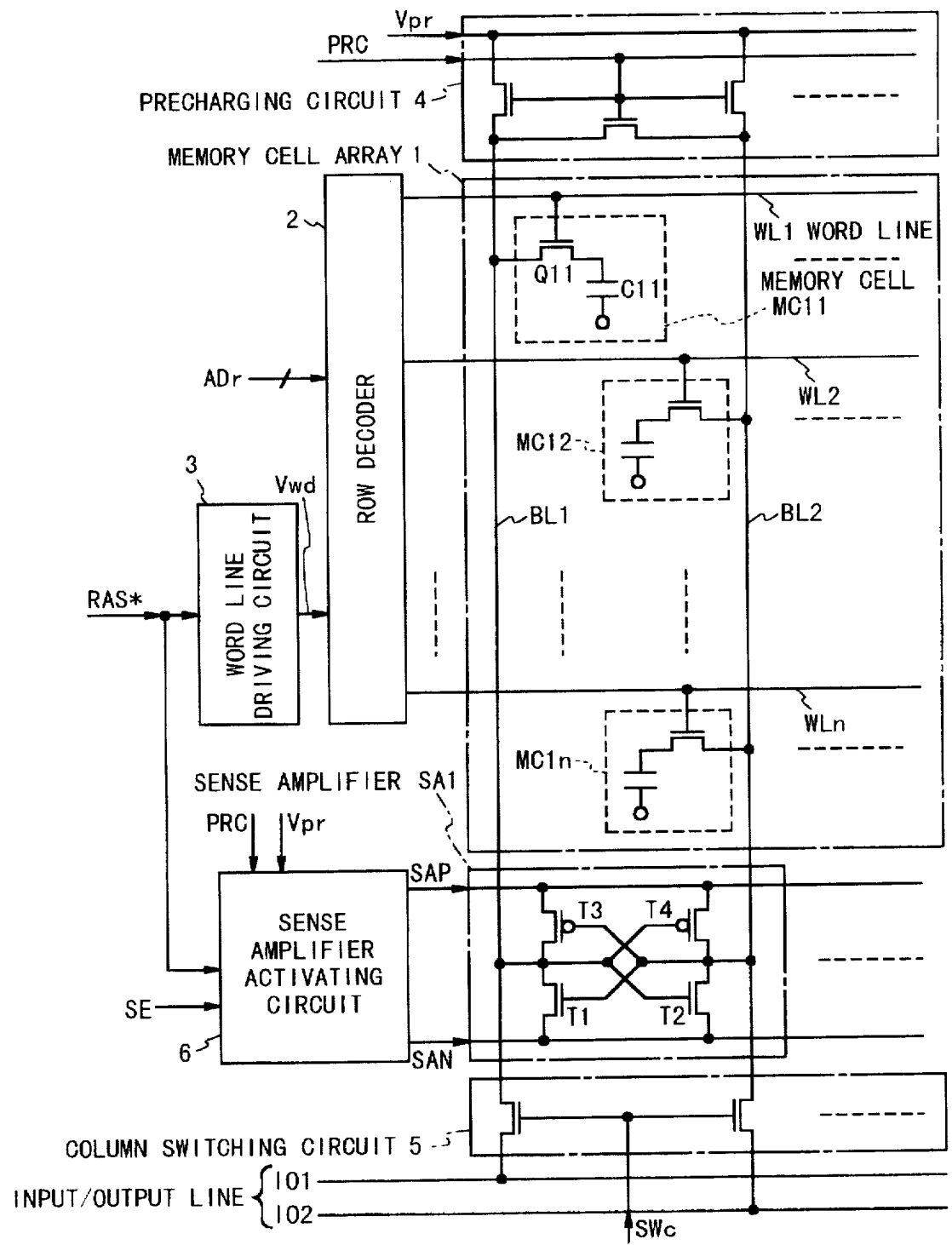
FIG. 6 is a circuit block diagram illustrating the structure of a semiconductor memory device according to a first embodiment of the present invention.

FIG. 6 is a circuit block diagram illustrating the structure of a semiconductor memory device according to the first embodiment of the present invention. Referring to FIG. 6, the dynamic-type semiconductor memory device includes a memory cell array 1. The memory cell array 1 is composed of a plurality of memory cells MCs (MC11 to MC1n . . . MCmn) (only one column is shown in FIG. 6) which are arranged in a matrix in rows and columns. Each memory cell includes a switching MOS transistor Q1 and a capacitor element C1 connected thereto in series. Data is readout from or written into the memory cell C1 in a selected state. A plurality of word lines WLs (WL1 to WLn) are connected to a row decoder 2 and correspond to respective rows of the plurality of memory cell MCs which are arranged in the matrix. The row decoder 2 selects one of the plurality of word lines WLs in accordance with a row address signal ADr so that the memory cells connected to the selected word line are set in a selected state. The row decoder 2 is also connected to a word line driving circuit 3 which drives the selected word line. A plurality of bit lines BLs (BL1 to BL2, . . . ) are provided to correspond to respective columns of the plurality of memory cells MCs arranged in the matrix. An odd numbered bit line BL1 and adjacent even numbered bit line BL2 are paired. Each of the plurality of bit line BL transfers one of a read data, a write data or a rewrite data from or to the memory cell MC connected to the selected word line in the column direction. Each of the pairs of bit lines BLs is connected to a corresponding one of a plurality of flip-flop-type sense amplifiers SAs (SA1 . . . ) (only one is shown in FIG. 6), each of which includes MOS transistors T1 to T4. Each sense amplifier amplifies the data which is read from the memory cell MC in the selected state and a write data which is externally supplied, at a predetermined timing to output on the pair of bit lines BLs as re-write data and write data, respectively. A precharging circuit 4 is connected to the pairs of bit lines. The precharging circuit 4 equalizes the potentials of the bit lines BLs of each pair in response to a precharge control signal PRC and at the same time precharges the potentials of the bit lines BLs to a potential Vpr which equals half of the higher side power supply potential Vdd, i.e., Vpr=½×Vdd, where Vdd is a power supply voltage. A column switching circuit 5 connects the pair of bit lines BL1 and BL2 to input/output lines I01 and I02 in response to a column selection signal SWc. A sense amplifier activating circuit 6 controls the sense amplifiers SA to be activated in response to sense amplifier activating signals SAP and SAN.

In the sense amplifier activating circuit 6 of the semiconductor memory device, when a write or re-write data is transferred to and written into a memory cell MC in a selected state, a potential which is higher than a power supply higher side potential by a first predetermined potential, e.g., a potential corresponding to a threshold voltage of a MOS transistor, i.e., a first boosted potential, is supplied to a higher potential receiving node of the sense amplifier SA during a predetermined time period before the word line is changed from the selection level to the non-selection level such that a potential on the high potential side of the bit lines is equal to a potential which is higher than the power supply higher side potential by the threshold voltage. The word line driving circuit 3 drives the selected word line to a potential which is higher by a second predetermined potential than the potential which is higher than the power supply higher side potential by the first predetermined potential, i.e., a second boosted potential.

Next, referring to the signal wave forms shown in FIGS. 7A to 7F, the operation of the semiconductor memory device according to the first embodiment of the present invention will be described below.

In the present invention, the first boosted potential is set to a potential (Vdd+Vt) which is higher than the power supply higher side potential Vdd by the threshold voltage Vt of an N-channel MOS transistor. Also, the selection level of the word line is set to a potential (Vdd+2Vt) which is further higher than the first boosted potential by the threshold voltage of the switching transistor Q1 (the N-channel MOS transistor).

Figure 7:
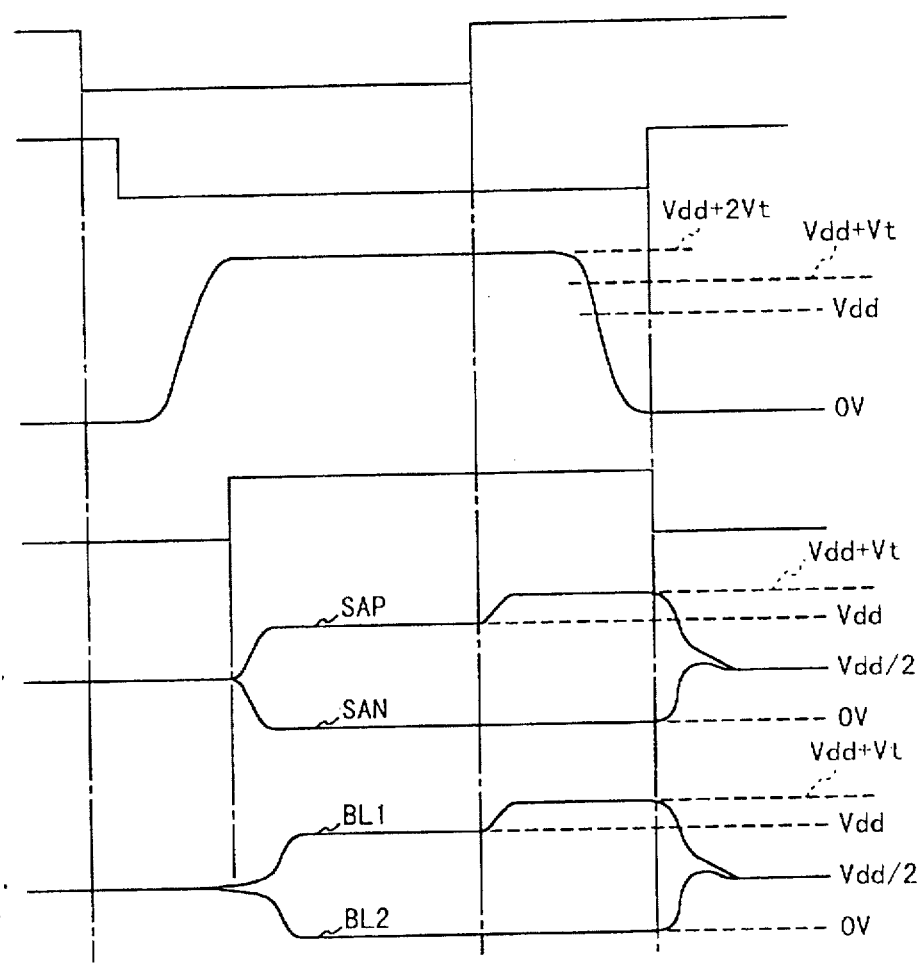
FIGS. 7A to 7F are diagrams of signal wave forms to explain the operation of the semiconductor memory device including a first example of a word line driving circuit according to the first embodiment of the present invention.

In the present invention, when the row address strobe signal RAS* is first changed to the low level as the active level as shown in FIG. 7A, the precharge control signal PRS is then changed to the low level as the inactive level as shown in FIG. 7B, so that the precharging operation of the bit lines BL1 and BL2 is stopped. Then, one of the word lines, for example, the word line WL1 in this example, is selected by the row decoder 2 to be set to the selection level as shown in FIG. 7C. The selection level of the selected word line WL1 is boosted to the voltage (Vdd+2Vt) by the word line driving circuit 3. Then, the memory cell MC11 which is connected to the selected word line WL1 of the selection level is selected to be set to the selected state. As a result, the memory cell MC11 is connected to the corresponding bit line BL1 and the potential of the bit line BL1 changes from the precharge potential Vpr (=Vdd/2) in accordance with the data stored in the memory cell MC11. On the other hand, since the bit line BL2 paired with the bit line BL1 is not connected to any memory cell of the selected state, the potential of the bit line BL2 remains the precharge potential Vpr.

Thereafter, when the sense control signal SE is changed to the active level as shown in FIG. 7D, the sense amplifier activating signals SAP and SAN, which change from the precharge potential Vpr (=Vdd/2) to the power supply potential Vdd and ground potential Vee (=0 V), respectively as shown in FIG. 7E, are supplied from the sense amplifier activating circuit 6 to the sense amplifier SA1. The sense amplifier SA1 is activated to change the potential of one of the bit lines BL1 and BL2, e.g., bit line BL1, to the high level equal to the power supply voltage Vdd, and to change the potential of other, e.g., the bit line BL2, to the low level equal to the ground potential as shown in FIG. 7F. Subsequently, the column selection signal SWc is changed into the selection level and as a result of this, the amplified data on the bit lines BL1 and BL2 are transferred to the input/output lines I01 and I02 and outputted outside.

When the row address strobe signal RAS* is changed to the high level as the inactive level as shown in FIG. 7A, the sense amplifier activating signal SAP is increased in potential level to the potential of (Vdd+Vt) as shown in FIG. 7E. The sense amplifier SA1 increases the potential of the bit line BL1 on the side of high level side to the potential of (Vdd+Vt) in response to the increasing of the bit line BL1 as shown in FIG. 7F. As a result, the data of the high level having the potential of (Vdd+Vt) is re-written in the capacitive element C1 of the memory cell MC11 in the selected state. After the word line WL1 of the selection level is changed to the non-selection level, the data of the high level is held in the memory cell MC11. Thus, the re-writing and refreshing operations end. Thereafter, the precharge control signal PRC is again set to the active level as shown in FIG. 7B, and the bit lines BL1 and BL2 are again precharged to the precharge potential Vpr(=Vdd/2) as shown in FIG. 7F. Also, the sense amplifier activating signals SAP and SAN are returned to the precharge potential Vpr(=Vdd/2) as shown in FIG. 7E.

Figure 8:
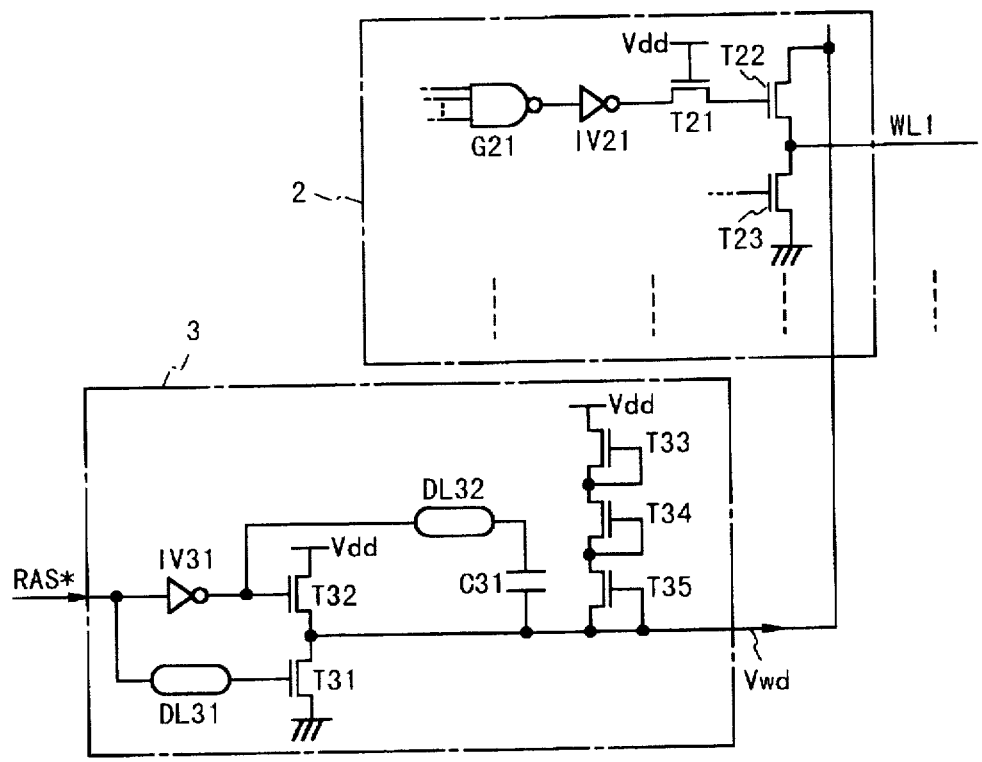
FIG. 8 is a circuit diagram illustrating the structure of a first example of a word line driving circuit and a row decoder in the semiconductor memory device according to the first embodiment of the present invention.

Next, FIG. 8 shows the structure of the first example of the word line driving circuit 3 and the sense amplification activation circuit 6 of the first embodiment. Referring to FIG. 8, the word line driving circuit 3 is composed of an inverter IV31 for receiving a row address strobe signal RAS* ("*" shows that the signal is active in the low level) at the input terminal, a delay circuit DL31 for delaying the row address strobe signal RAS* by a predetermined time, transistors T31 and T32 of an N-channel type which are connected between the power supply voltage Vdd and the ground potential in series and the gates of which are connected to the outputs of the delay circuit DL31 and inverter IV31, respectively, a delay circuit DL32 for delaying the output signal of the inverter IV31 by a predetermined time, and a capacitive element C31 which is connected to the output of the delay circuit DL32 at one terminal and connected at the other terminal to the connection node of the transistors T31 and T32 connected in series. The word line driving circuit 3 supplies the word line driving voltage Vwd to the row decoder 2 from the connection node of the transistors T31 and T32.

Figure 1:
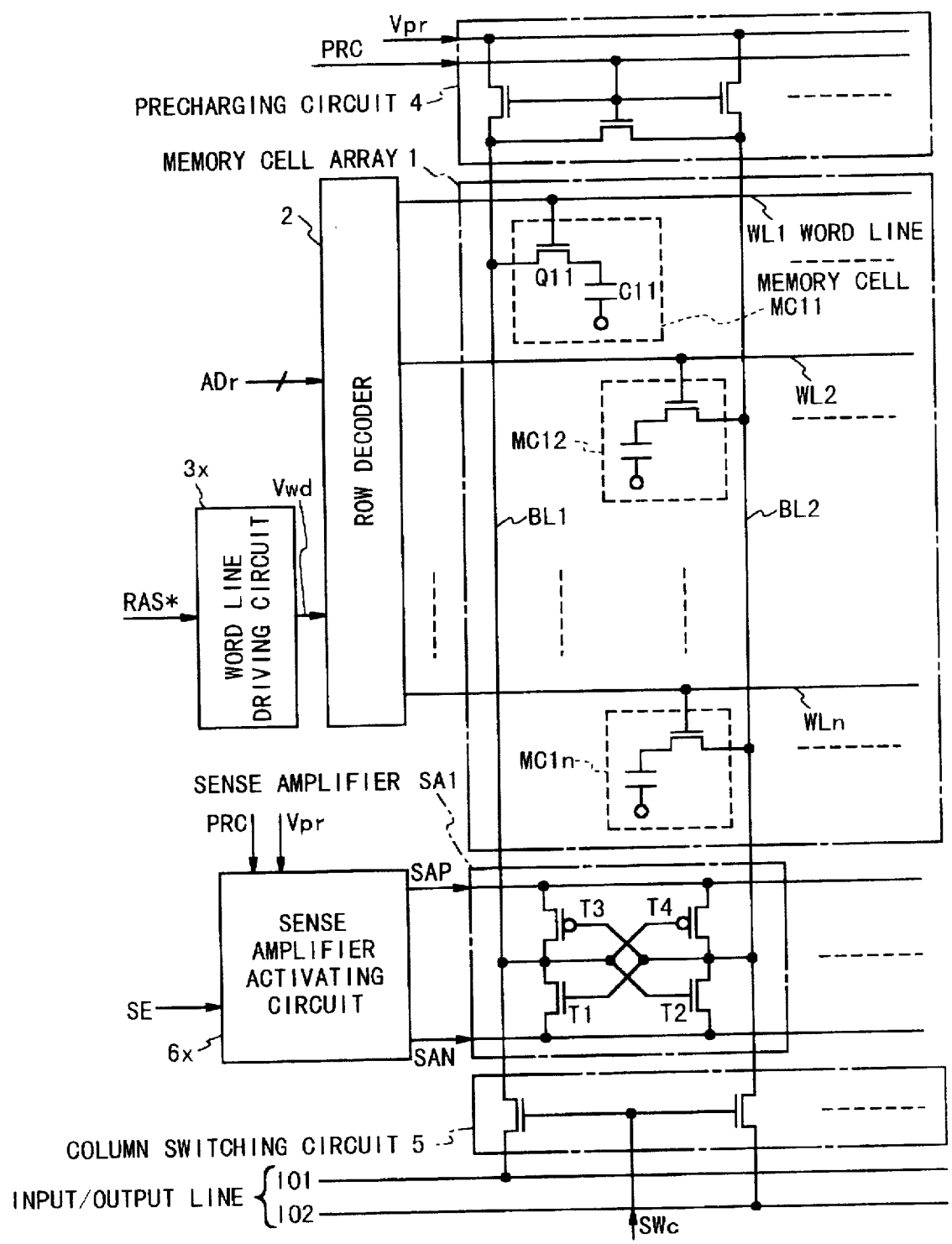
FIG. 1 is a circuit block diagram illustrating the structure of a first conventional dynamic-type semiconductor memory device.

The structure of the word line driving circuit 3 is similar to the word line driving circuit 3x of the conventional semiconductor memory device shown in FIG. 1. However, the value of the capacitive element C31 is entirely different from the capacitive element C33 in the conventional example. In the conventional example, the capacitive element C33 is designed to have a value such that the selection level of the selected word line can be set to a voltage of (Vdd+Vt), which is higher by the threshold value of the switching transistor Q1 of the memory cell MC11 than the power supply higher side potential Vdd. On the other hand, in the first embodiment, the capacitive element C31 is designed to have a value such that the selection level of the selected word line can be set to the voltage of (Vdd+2Vt) which is higher by the threshold voltage of the switching transistor Q1 of the memory cell MC11 than the a voltage (Vdd+Vt) which in turn is higher than the power supply higher side potential Vdd by a predetermined voltage, e.g., the threshold voltage of the switching transistor Q1 of the memory cell MC11 in the first embodiment.

In the word line driving circuit 3, when the row address strobe signal RAS* is changed to the low level as the active level, the transistor T32 which receives the output voltage of the inverter IV31 is turned on. Subsequently, the transistor T31 which receives the output voltage of the delay circuit DL31 is turned off. As a result, the potential of the capacitive element C31 on the side of output terminal of the word line driving voltage Vwd is charged up to voltage of (Vdd−Vt). Subsequently, the delay circuit DL32 delays the output voltage of the inverter IV31. Therefore, because the voltage of the capacitive element C31 on the side of input terminal is changed to the power supply voltage Vdd, the word line driving voltage Vwd is boosted from the voltage of (Vdd−Vt) by the voltage Vdd. In this case, the transistor T22 of the row decoder 2 is already selected by a decoding section which includes the NAND gate G21 on the side of front-stage so that the gate is charged up to the potential level of (Vdd−Vt) to set the transistor T22 to the ON state and the transistor T23 to the OFF state. As the word line driving voltage Vwd is increased, the gate potential of the transistor T22 is further increased due to the capacitance between the drain and the gate such that the transistor T21 is turned off. As a result, the boosted potential is held so that the transistor T22 is kept in the ON state. As a result, the word line driving voltage Vwd is transferred to the word line selected by the transistor T22. Thus, the potential of the selection level of the selected word line is determined based on the value Cw of the parasitic capacitance of the selected word line and the capacitance value of the capacitive element C31. That is, the following equation is satisfied.

$$C31 \times (Vdd-Vt) = (C31+Cw) \times 3Vt$$

In the first embodiment, the capacity value of the capacitive element C31 is determined in such a manner that the selection level of a selected word line becomes the voltage (Vdd+2Vt) at least, as seen from the above equation. Also, the upper value of this selection level is limited by the transistors T33 to T35 in such a manner that the selection level is not made higher than a voltage (Vdd+2Vt).

Figure 9:
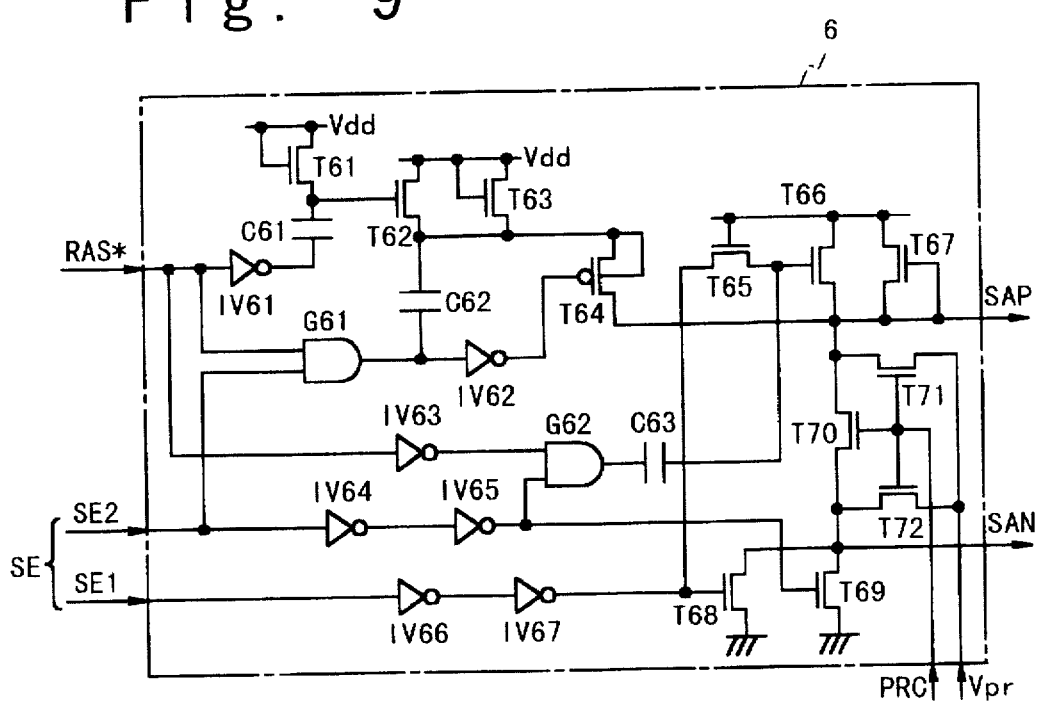
FIG. 9 is a circuit diagram illustrating the structure of a first example of a sense amplifier activating circuit in the semiconductor memory device according to a first embodiment of the present invention.

Next, the first example of a sense amplifier activating circuit 6 will be described below with reference to FIG. 9. The address strobe signal RAS* is changed to the high level as the inactive level, and the voltage across the both terminals of the capacitive element C61 is charged up by the transistor T61. The gate of the transistor T62 is already charged up to the voltage of (Vdd−Vt). Next, when the row address strobe signal RAS* is changed to the low level as the active level, the gate of the transistor T62 is boosted to a voltage equal to or higher than the power supply voltage Vdd by the inverter IV61 and the capacitive element C61, so that the transistor T62 is turned on. As a result, the voltage across both terminals of the capacitive element C62 is charged up such that the sources of the transistors T62 and T64 are set to the power supply voltage Vdd.

Next, when the sense control signal SE1 goes up to the high level, the transistor T68 is turned on such that the sense amplifier activating signal SAN is changed to the ground potential (0 V). Also, the transistor T66 is turned on through the transistor T65 such that the sense amplifier activating signal SAP is increased up to the voltage of (Vdd −2Vt) by the transistor T65. The signal SAP is increased only to the voltage (Vdd−Vt) because the gate voltage of the transistor T66 is boosted only to (Vdd−2Vt) by the transistor T65. At this time, the voltage between both terminals of the capacitive element C63 is charged up to a voltage of (Vdd−Vt).

Next, when the sense control signal SE2 goes up to the high level, the gate of the transistor T66 is boosted to a voltage equal to or higher than the power supply voltage Vdd by the capacitive element C63. As a result, the sense amplifier activating signal SAP is set to the power supply voltage Vdd by the transistor T66. On the other hand, the sense amplifier activating signal SAN is rapidly reduced to ground potential by the transistor T69.

Next, when the row address strobe signal RAS* is changed to the high level as the inactive level, the gate potential of the transistor T66 is returned to potential of (Vdd−Vt). Because the sense amplifier activating signal SAP is at the power supply voltage Vdd level, the transistor T66 is turned off. Also, the transistor T64 is turned on. Accordingly, the sense amplifier activating signal SAP is boosted by the capacitive element C62 which has been charged up to the power supply voltage Vdd. In this case, when the capacitance value of the signal line of the sense amplifier activating signal SAP is $C_{SAP}$, if the capacity value C62 of the capacitive element C62 satisfies the following equation:

$$C62 \cdot Vdd = (C62+C_{SAP}) \cdot Vt$$

the sense amplifier activating signal SAP can be set to the voltage (Vdd+Vt). The transistor T67 functions as a limiter which suppresses the sense amplifier activating signal SAP to the voltage (Vdd+Vt).

Thereafter, the sense control signals SE1 and SE2 are changed to the low level such that the transistors T64, T68 and T69 are turned off. By setting the precharge control signal PRC to the high level, the transistors T70, T71 and T72 are turned on such that the sense amplifier activating signals SAP and SAN are set to the precharge potential Vpr (=Vdd/2).

As described above, the sense amplifier activating circuit 6 is composed of a section including the gate G62, the capacitive element C63, the transistors T65 and T66, and so on, for driving and controlling the sense amplifier activating signal SAP to the Vdd level, a section including the capacitive elements C61 and C62, the inverters IV61 and IV62, the transistors T61 to T64, and so on, for driving and controlling the sense amplifier activating signal SAP to the voltage of (Vdd+Vt), a section including the transistors T68 and T69, and so on, for driving and controlling the sense amplifier activating signal SAN to the ground potential, and a section including the transistors T70 to T72, and so on, for driving and controlling the signals SAP and SAN to the precharge potential Vpr (=Vdd/2).

In this manner, in the first embodiment, data having as the high level a potential higher than the power supply voltage by a predetermined potential, e.g., the threshold voltage of a MOS transistor is written in a memory cell of the selected state. Therefore, even if the power supply voltage is decreased, the potential level of data read out from the memory cell into the bit lines can be made high, so that the sense amplifying operation and the data reading operation can be sped up.

Figure 10:
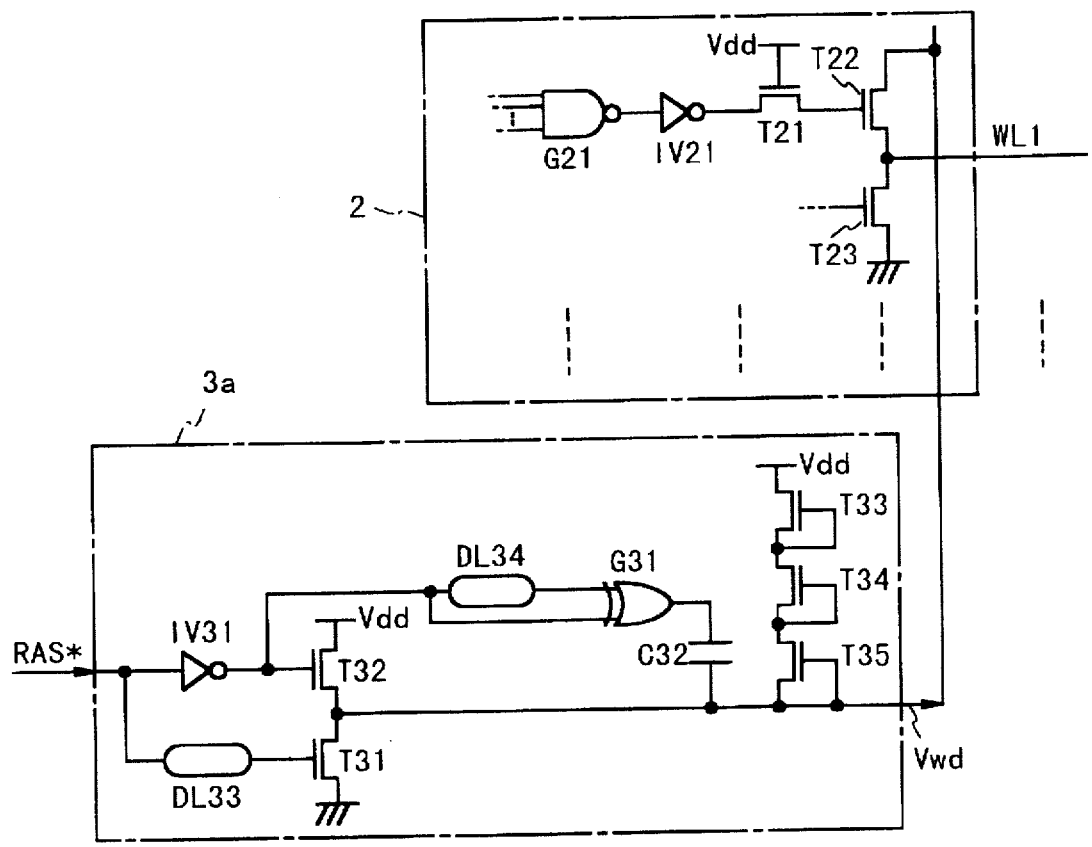
FIG. 10 is a circuit diagram illustrating the structure of a second example of a word line driving circuit of the semiconductor memory device according to the first embodiment of the present invention.
Figure 11:
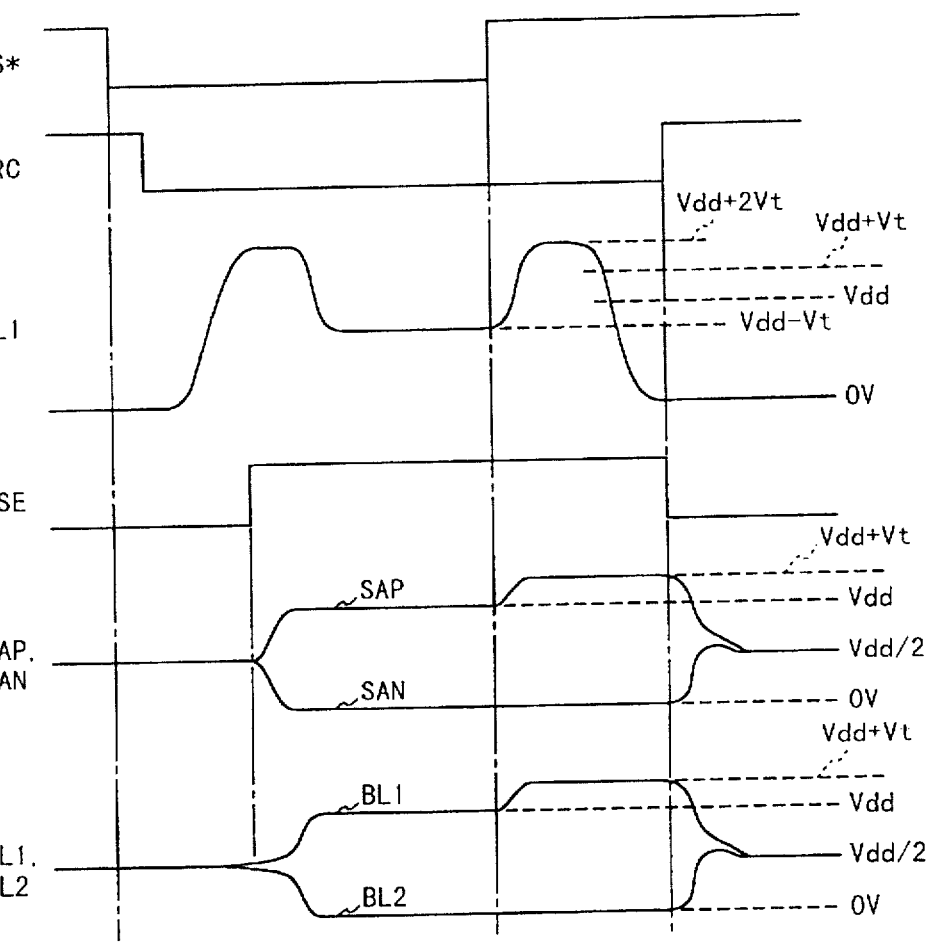
FIGS. 11A to 11F are diagrams of signal wave forms of various portions to explain the operation of the semiconductor memory device including the second example of a word line driving circuit according to the first embodiment of the present invention.

FIG. 10 is a circuit diagram illustrating a second example of a word line driving circuit of the semiconductor memory device according to the first embodiment of the present invention. The second example of the word line driving circuit 3a shown in FIG. 10 is used in place of the word line driving circuit 3 shown in FIG. 8. FIGS. 11A to 11F show the signal wave forms of the word line driving circuit 3a shown in FIG. 10.

In the second example, the selection level of the selected word line, e.g., the word line WL1 is set to the voltage (Vdd+2Vt) during a predetermined time period from the rising time to the selection level and during a predetermined time period before the falling time to the non-selection level. The selection level is set to the voltage (Vdd−Vt) during a time period other than the above-mentioned two predetermined time periods. The predetermined time periods are determined by the delay circuit DL34 and the EX-OR gate G31 and the voltage level is determined based on the capacitance value of the capacitive element C32 and the stray capacitance value of the word line in the selection level.

By employing such a word line driving circuit, excessive stress to the transistors which are connected to the selected word line can be avoided, so that degradation of the transistors can be reduced.

Figure 4A:
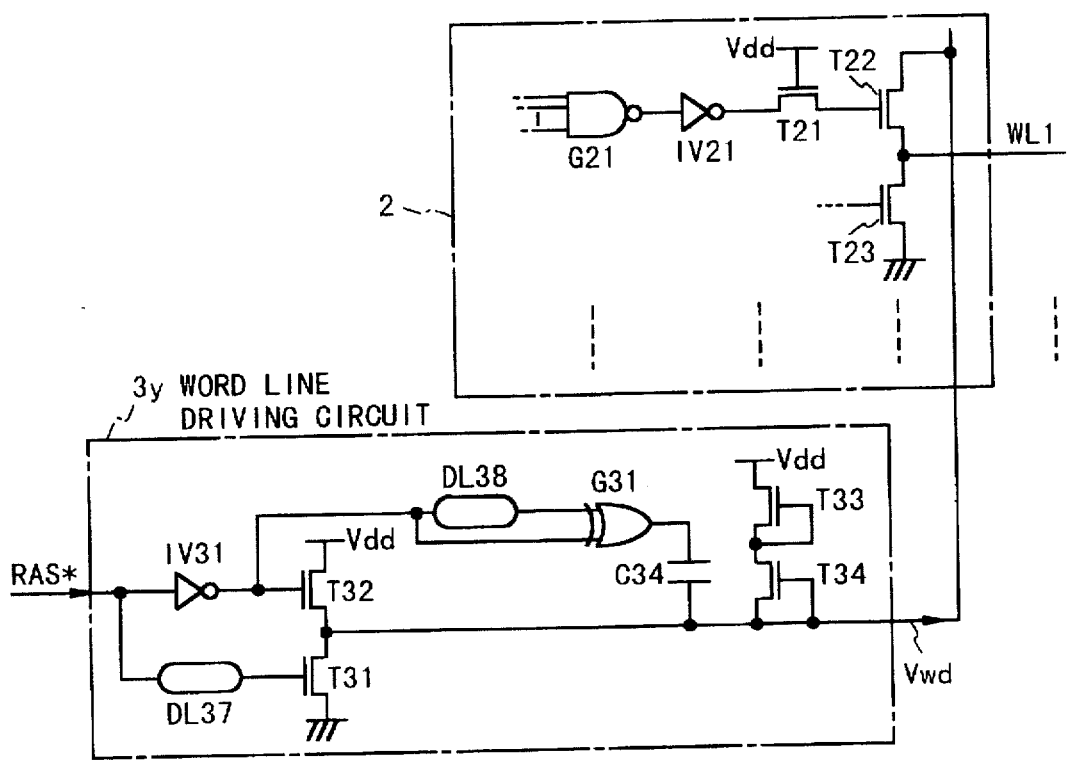
FIGS. 4A and 4B are circuit diagrams illustrating the structures of second and third examples of word line driving circuits of the conventional dynamic-type semiconductor memory device, respectively.
Figure 4B:
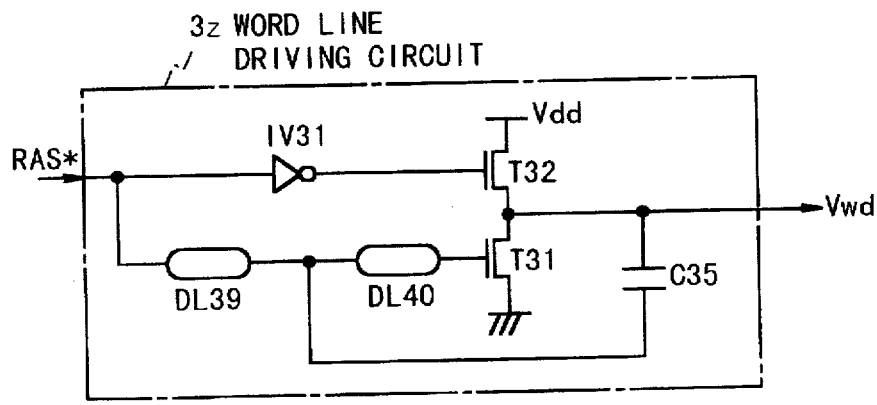

In the second example of a word line driving circuit, the advantage of the first example can be also obtained. Also, if the word line driving circuit is composed as the circuit of FIG. 4B but the capacitance value of the capacitive element C35 is different, it is possible for the selection level of the selected word line to be set to the potential of (Vdd+2Vt) only during a predetermined time period before the falling time to the non-selection level.

Figure 12:
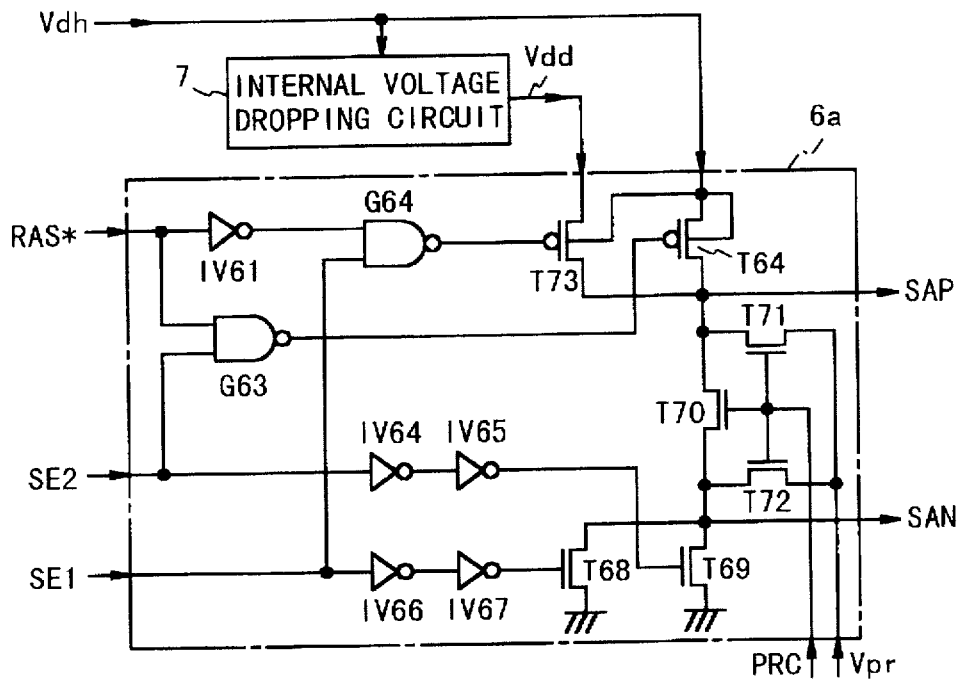
FIG. 12 provides circuit diagrams illustrating the structure of the semiconductor memory device with an internal voltage dropping circuit according to a second embodiment of the present invention.
Figure 13:
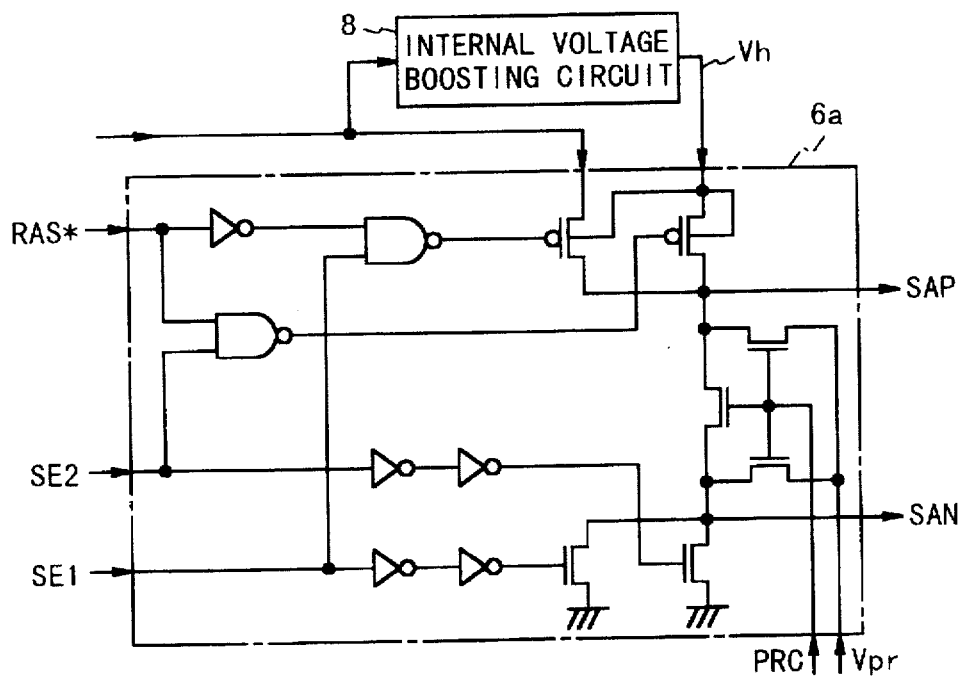
FIG. 13 provides circuit diagrams illustrating the structure of the semiconductor memory device with an internal voltage boosting circuit according to a third embodiment of the present invention.

FIGS. 12 and 13 mainly show circuit diagrams of a semiconductor memory device including a sense amplifier activating circuit according to the second and third embodiments of the present invention.

In the second embodiment shown in FIG. 12, the present invention is applied to a dynamic-type semiconductor memory device which has an internal voltage dropping circuit 7 for decreasing a power supply voltage Vdh supplied from the outside to produce the power supply voltage Vdd for each circuit. In the second embodiment, the power supply voltage Vdh supplied from the outside is used for the sense amplifier activating signal SAP as a voltage higher than the power supply voltage Vdd by a predetermined voltage. By employing such a structure, the circuit structure of the sense amplifier activating circuit 6a can be simplified and moreover the number of circuit elements can be reduced.

In the third embodiment shown in FIG. 13, the present invention is applied to a dynamic-type semiconductor memory device which has an internal voltage boosting circuit 8 that boosts the power supply voltage Vdd supplied from the outside to supply the boosted voltage to inner circuits.

In the third embodiment, the voltage Vh boosted by the internal voltage boosting circuit 8 is used for the sense amplifier activating signal SAP as the potential which is higher than the power supply voltage Vdd by a predetermined potential. In the second embodiment, the circuit structure of the sense amplifier activating circuits 6a can be simplified and moreover the number of circuit elements can be reduced, as in the third embodiment.

In the case of a 16-Mbit DRAM, for example, the sense amplifier activating circuit is typically provided on the basis of a 512-Kbit unit. Therefore, 32 sense amplifier activating circuits are required. However, the number of circuit elements can be considerably reduced by using the output voltage of the internal voltage dropping circuit 7 or the internal voltage boosting circuit 8, or the power supply voltage from the outside in common in the 32 sense amplifier activating circuits 6a.

Note that in the second and third embodiments, the same advantages can be obtained as in the first embodiment. Also, the second and third embodiments can be combined with the first or second example of a word line driving circuit of the first embodiment.

In the above description, the word line driving circuit 3 drives the selected word line to the potential of (Vdd+2Vt), the sense amplifier activating circuit 6 drives the sense amplifier activating signal SAP to the potential of (Vdd+Vt), and the the voltage Vt is the threshold voltage of the MOS transistor in the memory cell. In this case, the voltage Vt of the N-channel MOS transistor in the memory cell, for example, transistor Q1 in FIG. 6 can be different from that of a MOS transistor in the other circuit area, for example, T31 or T32 in FIG. 8. However, the present invention can be applied to such a case. That is, the voltage Vt as described above may be the threshold voltage of the MOS transistor in the other circuit area.

As described above, according to the present invention, when data is written in a memory cell in a selected state, because the data is written in the memory cell to have as a high level a potential higher than the power supply voltage by a threshold voltage, the potential level of the data read out from the memory cell onto the bit line can be higher. Therefore, the sense amplifying operation and the reading operation can be sped up.

What is claimed is:

1. A semiconductor memory device, comprising:

a memory cell array including a plurality of memory cells arranged in a matrix;

a plurality of pairs of bit lines, the memory cells in each of columns of said matrix being associated with one of said plurality of pairs of bit lines corresponding to the column;

a plurality of word lines, the memory cells in each of rows of said matrix being connected to one of said plurality of word lines corresponding to the row;

sense amplifier means comprised of a plurality of sense amplifiers respectively provided for said plurality of pairs of bit lines, wherein each of said plurality of sense amplifiers amplifies a data on its corresponding pair of bit lines in response to sense amplifier activating signals;

a row decoder connected to said plurality of word lines, for selecting one of said plurality of word lines in response to a row address;

input/output means provided to be connectable to said plurality of pairs of bit lines, for inputting or outputting a data;

column selecting means for selecting and connecting one of said plurality of pairs of bit lines to said input/output means in response to a column address;

word line driving means for driving, in response to a row address strobe signal, a word line selected by said row decoder to a first potential which is higher by a predetermined potential than a second predetermined potential, for a read or write operation to one memory cell connected to said selected word line and said pair of bit lines selected by said column selecting means as a selected memory cell, said second potential being higher than a power supply higher side potential; and sense amplifier activating means for issuing said sense amplifier activating signals to said sense amplifier means for the write operation to said selected memory cell in response to a sense control signal such that one of the bit lines of said selected pair is driven to said second potential.

2. A semiconductor memory device according to claim 1, wherein said word line driving means drives said selected word line to said first potential while said word line is in a selected state.

3. A semiconductor memory device according to claim 2, wherein said sense amplifier activating means issues said sense amplifier activating signals to said sense amplifier means in response to said sense control signal such that one of said selected pair of bit lines is driven to said second potential when a data read from said selected memory cell is rewritten in said selected memory cell or a data is written in said selected memory cell.

4. A semiconductor memory device according to claim 1, wherein said word line driving means drives said selected word line to said first potential during a first predetermined time period when a data is read from said selected memory cell and a second predetermined time period when the read data is re-written in said selected memory cell or a data is written in said selected memory cell.

5. A semiconductor memory device according to claim 4, wherein said sense amplifier activating means issues said sense amplifier activating signals to said sense amplifier means in response to said sense control signal such that one of said selected pair of bit lines is driven to said second potential during a third predetermined time period corresponding to said second predetermined time period.

6. A semiconductor memory device according to claim 4, wherein said word line driving means drives said selected word line to a third potential which is lower than said power supply higher side potential during a time period between said first predetermined time period and said second predetermined time period.

7. A semiconductor memory device according to claim 1, further comprising an internal voltage dropping circuit for dropping a supply voltage externally supplied, said second potential corresponding to said supply voltage externally supplied.

8. A semiconductor memory device according to claim 1, further comprising an internal voltage boosting circuit for boosting a supply voltage externally supplied, said second potential corresponding to the boosted supply voltage.

9. A semiconductor memory device according to claim 5, wherein said sense amplifier activating means includes:

a first section for selectively driving one of said sense amplifier activating signals to said power supply higher side potential;

a second section for selectively driving the one of said sense amplifier activating signals to said second potential;

a third section for driving the other of said sense amplifier activating signals to the ground potential; and a fourth section for driving said sense amplifier activating signals to a precharge potential.

10. A method of accessing a semiconductor memory device, comprising the steps of:

selecting one of a plurality of word lines in response to a row address, wherein a memory cell array includes a plurality of memory cells arranged in a matrix, and the memory cells in each of rows of said matrix are connected to one of said plurality of word lines corresponding to the row;

driving, in response to a row address strobe signal, said selected word line to a potential which is higher by double of a threshold voltage of a MOS transistor than a power supply higher side potential at least momentarily;

reading a data from one memory cell as a selected memory cell connected to said selected word line and a selected one of a plurality of pairs of bit lines;

issuing sense amplifier activating signals in response to a sense control signal;

amplifying the data read from said selected memory cell onto the selected pair of bit lines in response to sense amplifier activating signals; and selectively outputting the data on said selected pair of bit lines.

11. A method according to claim 10, further including:

rewriting the data read from said selected memory cell into said selected memory cell, and wherein said driving step includes holding the potential of said selected word line to said first potential while said selected memory cell is accessed.

12. A method of accessing a semiconductor memory device, comprising the steps of:

selecting one of a plurality of word lines in response to a row address, wherein a memory cell array includes a plurality of memory cells arranged in a matrix, and the memory cells in each of rows of said matrix are connected to one of said plurality of word lines corresponding to the row;

driving, in response to a row address strobe signal, said selected word line to a first potential which is higher by a predetermined potential than a predetermined second potential, said second potential being higher than a power supply higher side potential;

reading a data from one memory cell as a selected memory cell connected to said selected word line and a selected one of a plurality of pairs of bit lines;

issuing sense amplifier activating signals in response to a sense control signal;

amplifying the data read from said selected memory cell onto the selected pair of bit lines in response to sense amplifier activating signals;

selectively outputting the data on said selected pair of bit lines;

rewriting the data read from said selected memory cell into said selected memory cell, wherein said driving step includes holding the potential of said selected word line to said first potential while said selected memory cell is accessed; and wherein said issuing step includes issuing said sense amplifier activating signals for the rewrite operation into said selected memory cell in response to a sense control signal such that one of the bit lines of said selected pair is driven to said second potential.

13. A method of accessing a semiconductor memory device, comprising the steps of:

selecting one of a plurality of word lines in response to a row address, wherein a memory cell array includes a plurality of memory cells arranged in a matrix, and the memory cells in each of rows of said matrix are connected to one of said plurality of word lines corresponding to the row;

driving, in response to a row address strobe signal, said selected word line to a first potential which is higher by a predetermined potential than a predetermined second potential, said second potential being higher than a power supply higher side potential;

reading a data from one memory cell as a selected memory cell connected to said selected word line and a selected one of a plurality of pairs of bit lines;

issuing sense amplifier activating signals in response to a sense control signal;

amplifying the data read from said selected memory cell onto the selected pair of bit lines in response to sense amplifier activating signals;

selectively outputting the data on said selected pair of bit lines; and rewriting the data read from said selected memory cell into said selected memory, and wherein said driving step includes:

dropping the potential of said selected word line to a potential lower than said power supply higher side potential; and driving the potential of said selected word line to said first potential for the rewrite operation.

14. A method according to claim 13, wherein said issuing step includes issuing said sense amplifier activating signals for the rewrite operation into said selected memory cell in response to a sense control signal such that one of the bit lines of said selected pair is driven to said second potential.

15. A method of accessing a semiconductor memory device, comprising the steps of:

selecting one of a plurality of word lines in response to a row address, wherein a memory cell array includes a plurality of memory cells arranged in a matrix, and the memory cells in each of rows of said matrix are connected to one of said plurality of word lines corresponding to the row;

driving, in response to a row address strobe signal, said selected word line to a potential which is higher than a predetermined second potential, said second potential being higher than a power supply higher side potential;

reading a data from one memory cell as a selected memory cell connected to said selected word line and a selected one of a plurality of pairs of bit lines;

issuing sense amplifier activating signals in response to a sense control signal;

amplifying the data read from said selected memory cell onto the selected pair of bit lines in response to sense amplifier activating signals;

selectively outputting the data on said selected pair of bit lines; and dropping a supply voltage externally supplied, and wherein said second potential is a potential corresponding to said supply voltage externally supplied.

16. A method of accessing a semiconductor memory device, comprising the steps of:

selecting one of a plurality of word lines in response to a row address, wherein a memory cell array includes a plurality of memory cells arranged in a matrix, and the memory cells in each of rows of said matrix are connected to one of said plurality of word lines corresponding to the row;

driving, in response to a row address strobe signal, said selected word line to a potential which is higher than a predetermined second potential, said second potential being higher than a power supply higher side potential;

reading a data from one memory cell as a selected memory cell connected to said selected word line and a selected one of a plurality of pairs of bit lines;

issuing sense amplifier activating signals in response to a sense control signal;

amplifying the data read from said selected memory cell onto the selected pair of bit lines in response to sense amplifier activating signals;

selectively outputting the data on said selected pair of bit lines; and boosting a supply voltage externally supplied, and wherein said second potential is a potential corresponding to the boosted supply voltage.

* * * * *